United States Patent [19]

Sakai et al.

[11] Patent Number: 5,070,782
[45] Date of Patent: Dec. 10, 1991

[54] SCREEN PRINTER

[75] Inventors: Shigekazu Sakai; Masahiko Ishida, both of Gifu, Japan

[73] Assignees: Tokai Shoji Co., Ltd., Tokyo; Tokai Seiki Co., Ltd., Gifu, both of Japan

[21] Appl. No.: 533,357

[22] Filed: Jun. 5, 1990

[51] Int. Cl.⁵ .............................................. B41F 15/12
[52] U.S. Cl. .................................... 101/123; 101/115; 101/425; 101/423; 428/901; 29/829
[58] Field of Search ............... 101/114, 115, 123, 129, 101/416.1, 423, 424, 425; 118/213, 406; 428/901; 29/829

[56] References Cited

U.S. PATENT DOCUMENTS

| | | | |
|---|---|---|---|
| 4,389,936 | 6/1983 | Jaffa et al. | 101/123 |
| 4,509,455 | 4/1985 | Shirataki | 101/123 |
| 4,808,237 | 2/1989 | McCormick et al. | 101/425 |
| 4,813,352 | 3/1989 | Ericson | 101/425 |
| 4,989,510 | 2/1991 | Kölblin et al. | 101/123 |

FOREIGN PATENT DOCUMENTS

| | | | |
|---|---|---|---|
| 2750690 | 4/1979 | Fed. Rep. of Germany | 101/123 |
| 0209158 | 9/1986 | Japan | 101/425 |
| 0213158 | 9/1986 | Japan | 101/129 |
| 0158255 | 7/1988 | Japan | 101/425 |
| 1522069 | 8/1978 | United Kingdom | 101/129 |
| 2088284 | 6/1982 | United Kingdom | 101/129 |

Primary Examiner—Edgar S. Burr
Assistant Examiner—Christopher A. Bennett
Attorney, Agent, or Firm—Young & Thompson

[57] ABSTRACT

A screen printer comprising a squeegee for applying a printing material to a work face when the squeegee moves on an upper side face of a screen while being kept in contact therewith, a doctor for uniforming a thickness of the printing material left on the upper side face of the screen, and a cleaner including a scraping bucket which moves on the underside face of the screen while being kept in contact therewith so as to scrape the printing material attached to the underside face of the screen upon applying operation of the squeegee. The scraping bucket comprises a bucket body formed into a concave shape with an open top in profile, and a scraping strip formed on an end of one side wall of the bucket body, which is inclined toward an advance direction of the scraping bucket.

5 Claims, 7 Drawing Sheets

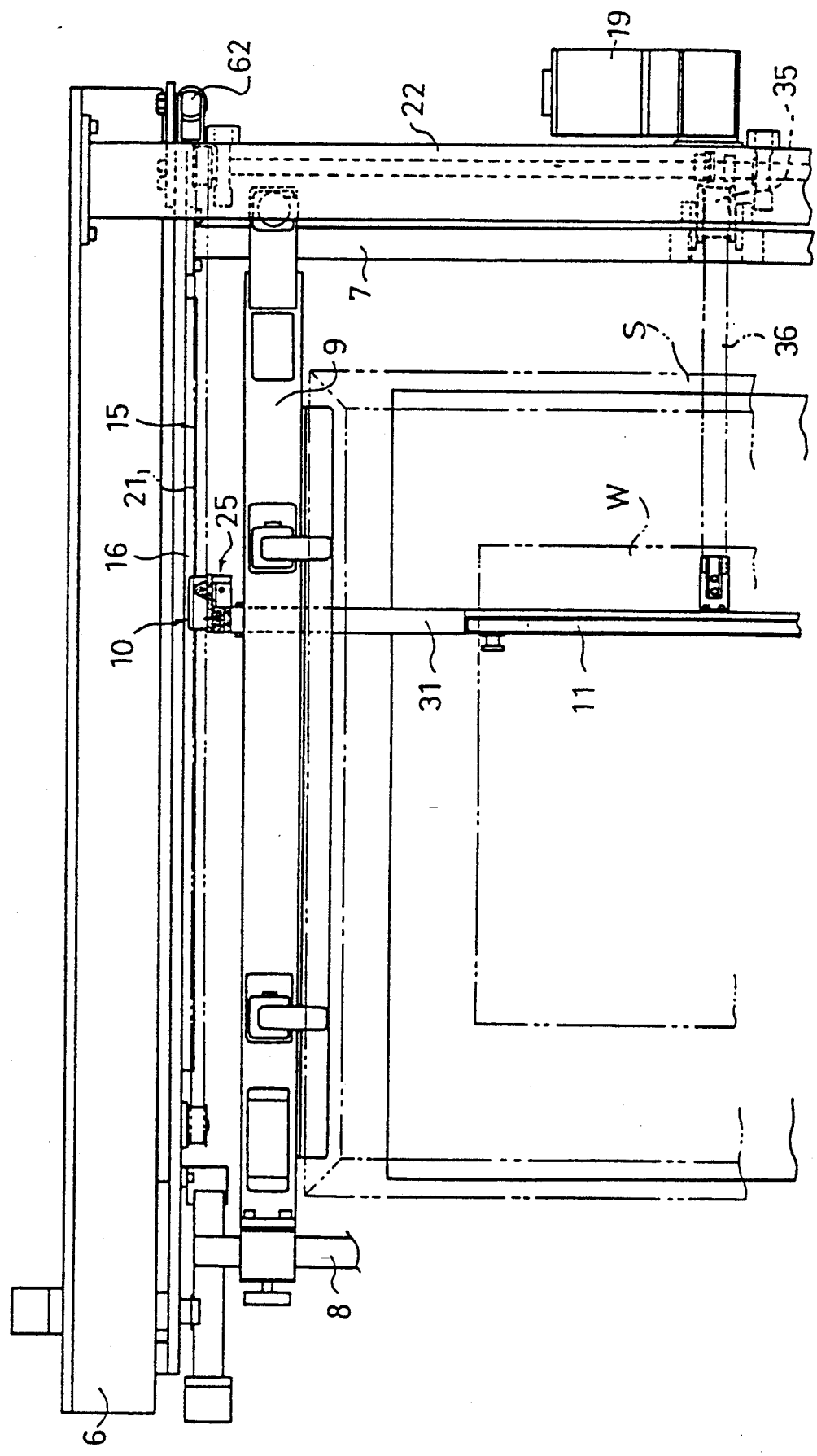

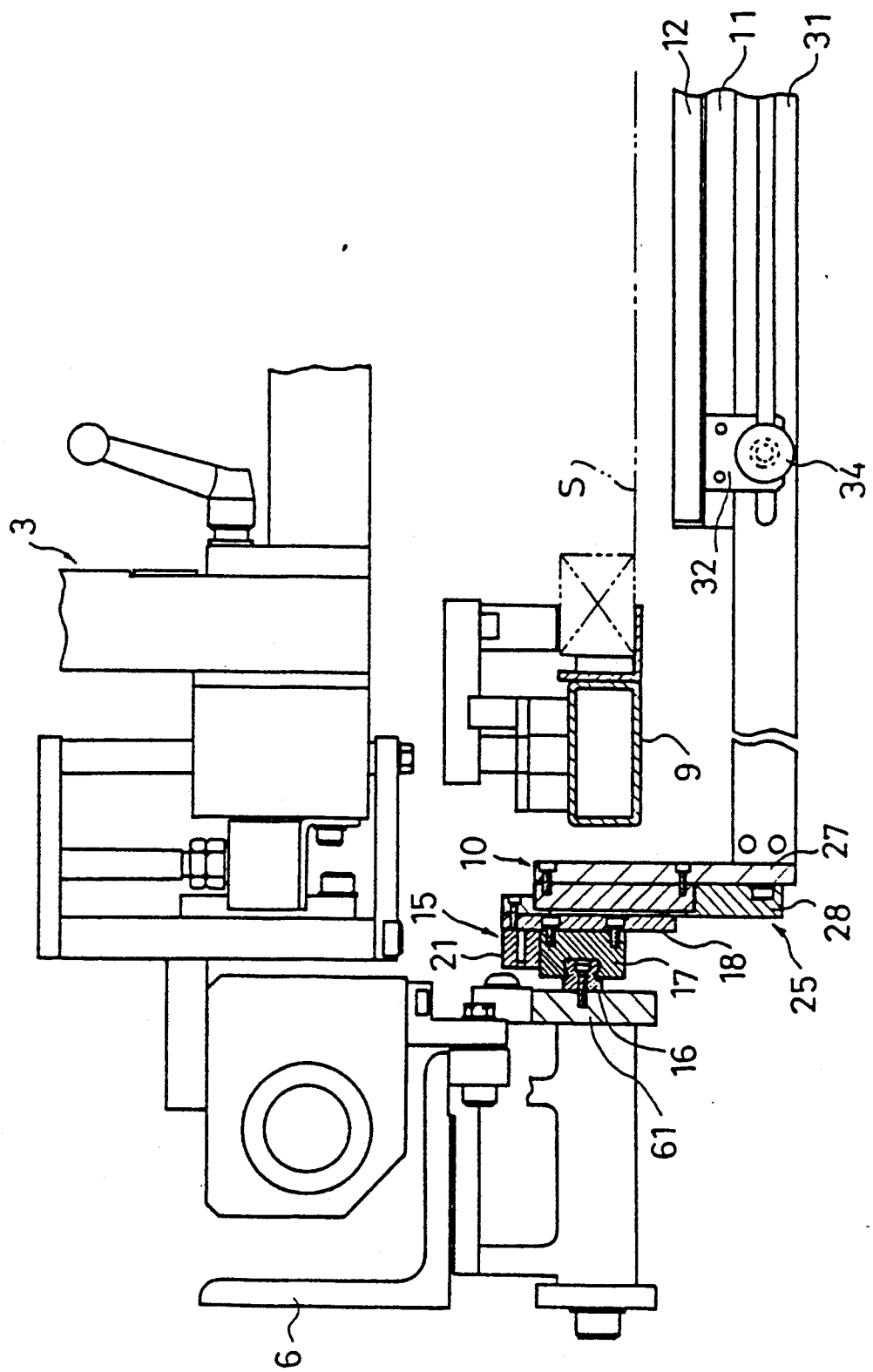

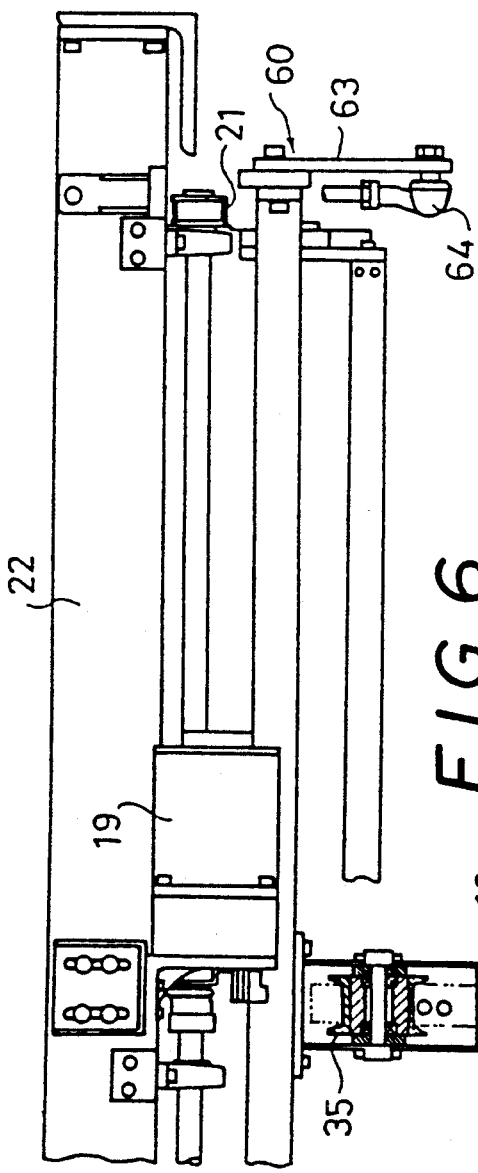
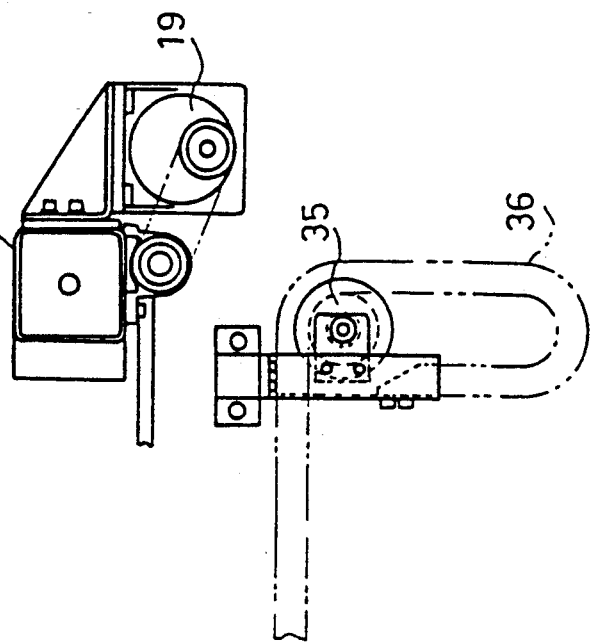
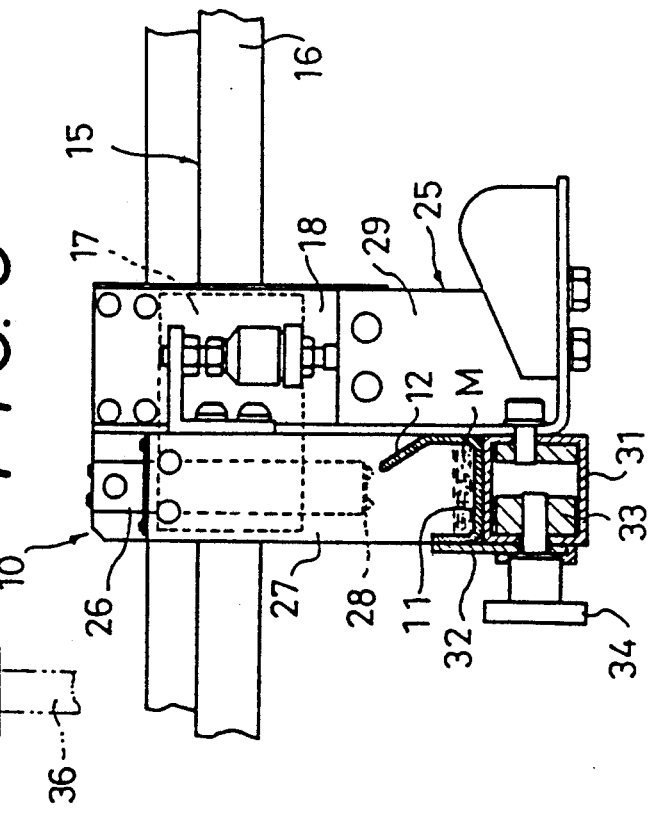

SCREEN PRINTER

FIELD OF THE INVENTION

This invention relates to a screen printer, particularly to the screen printer comprising means for removing a photo-sensitive material attached to portions of an underside face of a screen which correspond to through holes formed on a printed circuit board upon applying such a photo-sensitive material as a photo resist and the like to the printed circuit board.

BACKGROUND OF THE INVENTION

Conventionally a screen printer has been used for applying such a photo-sensitive material as a photo resist and the like to the printed circuit board. The screen printer comprises a squeegee for moving on an upper side face of the screen placed on the printed circuit board and thereby pushing and applying the photo-sensitive material placed on the screen to the printed circuit board, and a doctor for uniforming the photo-sensitive material placed in uneven thickness on the upper side face of the screen after the applying operation.

In this case, when the photo-sensitive material is applied to all area of the printed circuit board having through holes for wiring and the like, the photo-sensitive material is attached to portions of the underside face of the screen which correspond to the through holes. To this end, the photo-sensitive material attached to the under face of the screen is dropped on or transferred to the printed circuit board to be subjected to the applying operation, resulting in a defective printing and a considerable reduction of a yield of products.

In order to eliminate the above-mentioned problem occurring in a conventional screen printer, there have been proposed various apparatus for cleaning the underside face of the screen and removing the photo-sensitive material left thereon.

For instance, Japanese patent publication No. 60-26709 has disclosed an apparatus in which a work piece and cleaning paper are alternatively subjected to an applying operation such that the photo-sensitive material left on the underside face of the screen is transferred to the cleaning paper to be removed from the underside face of the screen. However, there are some kinds of photo-sensitive materials which are transferred to the cleaning paper with a great difficulty, so that a sufficient transfer of the photo-sensitive material can not be obtained even in the apparatus.

In addition, Japanese laid-open utility model publication No. 60-85931 has disclosed an apparatus comprising two squeegees one of which moves on the underside face of the screen while being kept in contact therewith. However, when such a squeegee for moving on the underside face of the screen is repeatedly used for removing the photo-sensitive material, the photo-sensitive material attached to the squeegee progressively causes reduction in a photo-sensitive material-removing capacity of the squeegee and in some cases returns to the underside face of the screen.

On the other hand, as proposed in the Japanese laid-open utility model publication No. 60-85931, there is provided an apparatus comprising a sweeping roller with a sweeping cloth for removing the photo-sensitive material attached to the underside face of the screen by pressing the roller against the underside face of the screen. In the apparatus, the sweeping cloth should move in synchronized relation to a rotation of the sweeping roller in order to subsequently supply the sweeping cloth. Therefore, the apparatus has disadvantages such that a control operation for the synchronization is complicated and a trace of sweeping is left on the underside face of the screen.

Further, Japanese laid-open patent publication No. 63-178047 has disclosed an apparatus in which the photo-sensitive material attached to the underside face of the screen is swept after being molten by a solvent. In accordance with such a sweeping method by using the solvent, it is difficult to uniformly spray the solvent onto the underside face of the screen. In addition, unless the solvent is completely swept from the underside of the screen, the solvent is transferred to a printed circuit board so that the photo-sensitive material applied to the printed circuit board forms a layer having uneven thickness thereon.

SUMMARY OF THE INVENTION

Accordingly, it is an object of the present invention to eliminate the above-mentioned problems upon using conventional apparatuses and provide a screen printer in which a photo-sensitive material attached to an underside face of a screen is scraped to be removed therefrom, the scraped photo-sensitive material is not attached again to the underside face of the screen, the photo-sensitive material left on the underside face portions of the screen corresponding to through holes of a printed circuit board is completely removed therefrom resulting in prevention of a defective printing.

In order to realize the object, a screen printer according to the invention comprises a squeegee for applying a printing material to a work face when the squeegee moves on an upper side face of a screen while being kept in contact therewith, a doctor for uniforming a thickness of the printing material left on the upper side face of the screen, and a cleaning means including a scraping bucket which moves on the underside face of the screen while being kept in contact therewith so as to scrape the printing material attached to the underside face of the screen upon applying operation of the squeegee. The scraping bucket comprises a bucket body formed into a concave shape with an open top in profile, and a scraping strip formed on an end of one side wall of the bucket body, which is inclined toward an advance direction of the scraping bucket.

The cleaning means is actuated by a horizontally actuating mechanism for moving the scraping bucket in an advance or retreat direction thereof along the underside face of the screen, a vertically actuating mechanism for moving the scraping bucket upward to a scraping-start position and downward to a scraping-end position, and a controlling mechanism for adjusting the scraping-start position and the scraping-end position.

Further, the horizontally actuating mechanism for the scraping bucket comprises a driving rail extending in an advance or retreat direction of the squeegee, a unit base plate slidably engaged with the rail, and a driving belt which is arranged on the unit base plate and extends in a moving direction of the unit base plate so as to be rotated.

The vertically actuating mechanism for the scraping bucket comprises a bucket pipe side plate vertical-movably mounted on a side face of the unit base plate, a vertically moving cylinder mounted on the unit base plate, a cylinder rod of the vertically moving cylinder connected to the bucket pipe side plate for supporting a bucket pipe on which the scraping bucket is detachably mounted, so that the bucket pipe side plate is vertically movable by action of the vertically moving cylinder.

The controlling mechanism for the scraping bucket comprises sensor base blocks which are slidably mounted on respective sensor rails extending in the advance or retreat direction of the squeegee in positions corresponding to the scraping-start position and the scraping-end position for the scraping bucket, and proximity sensors which are respectively mounted on the sensor base blocks in order to detect sensor plates fixed on the unit base plate. When the proximity sensor mounted in the scraping-start position detects the sensor plate, the bucket pipe side plate moves upward. On the other hand, when the proximity sensor mounted in the scraping-end position detects the sensor plate, the bucket pipe side plate moves downward.

In the screen printer according to the invention, when a work is delivered to be set in a predetermined position, a printing material is applied onto the work. In an applying operation in which the squeegee horizontally advances while being kept in contact with the screen, if such a printing material as a photo-sensitive material is squeezed through the screen and applied onto the work, for example a printed circuit board having a plurality of through holes, the photo-sensitive material is left on the underside face portions of the screen corresponding to the through holes.

At the end of the applying operation, the cleaning means starts its operation. The scraping bucket disposed in a stand-by position is actuated to advance by the horizontally actuating mechanism. When the scraping bucket reaches the proximity sensor mounted in the scraping-start position, the proximity sensor detects the sensor plate so that the vertically actuating mechanism for the scraping bucket starts its operation. Then, the vertically moving cylinder of the vertically actuating mechanism actuates the bucket pipe side plate to move upward so that an upper end of the scraping bucket abuts against the underside face of the screen.

When the upper end of the scraping bucket advances while being kept in contact with the underside face of the screen, the printing material attached to the underside face of the screen is scraped to be fallen into the scraping bucket. In this case, since the scraping strip of the scraping bucket is inclined toward the advance direction, the scraping bucket completely scrapes the printing material attached to the underside face of the screen and drops the material along the inclined underside of the scraping strip into the scraping bucket.

When the scraping bucket advances to reach the proximity sensor arranged in the scraping-end position, the proximity sensor detects the sensor plate so that the vertically actuating mechanism for the scraping bucket is actuated. Then, the vertically moving cylinder of the vertically actuating mechanism actuates the bucket pipe side plate to move downward so that the upper end of the scraping bucket separates apart from the underside face of the screen.

After the separation of the upper end of the scraping bucket from the underside face of the screen, the doctor moves downward to contact an upper side face of the screen. The doctor retreats in inverse direction of the applying operation of the squeegee while being kept in contact with the upper side face of the screen so as to form a printing material layer of even thickness. The scraping bucket is synchronized with the retreat movement of the doctor to move backward and return to the scraping-start position for standing by a subsequent operation.

BRIEF DESCRIPTION OF THE DRAWINGS

The present invention will be more clearly understood from the following detailed description of the preferred embodiment of the invention with reference to the accompanying drawings, in which:

FIG. 4 is a plan view of an essential portion of FIG. 3;

FIG. 5 is a front view of an essential portion of the screen printer;

FIG. 6 is a side view of an essential portion of a vertical motion mechanism for a cleaning means of the screen printer;

FIG. 7 is a rear view of a driving motor mounting portion of the screen printer;

FIG. 8 is a side view of the driving motor mounting portion of FIG. 7;

PREFERRED EMBODIMENTS OF THE INVENTION

OUTLINE OF A SCREEN PRINTER

Figure 2:
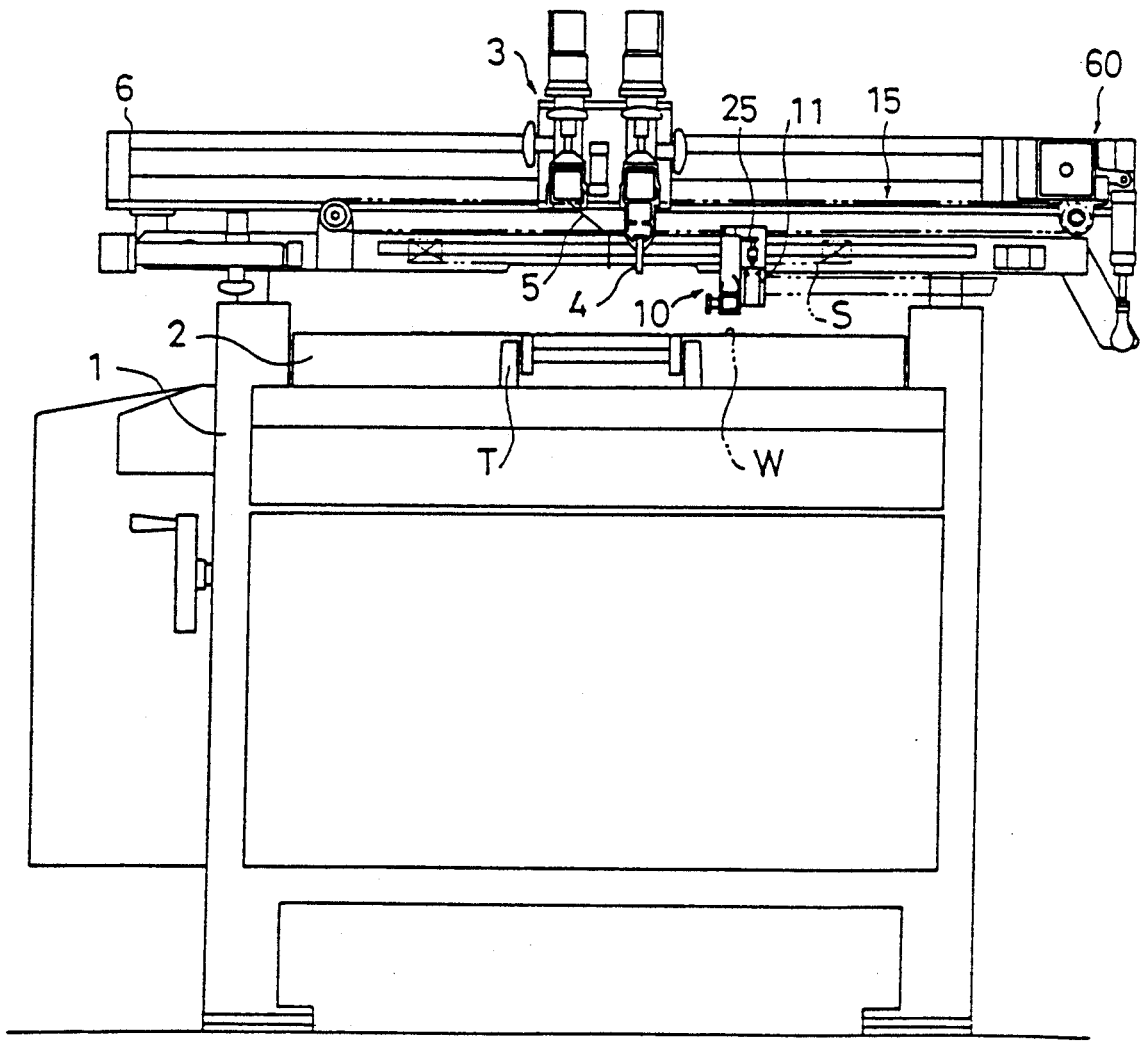
FIG. 2 is a schematic side view of the screen printer.
Figure 3:
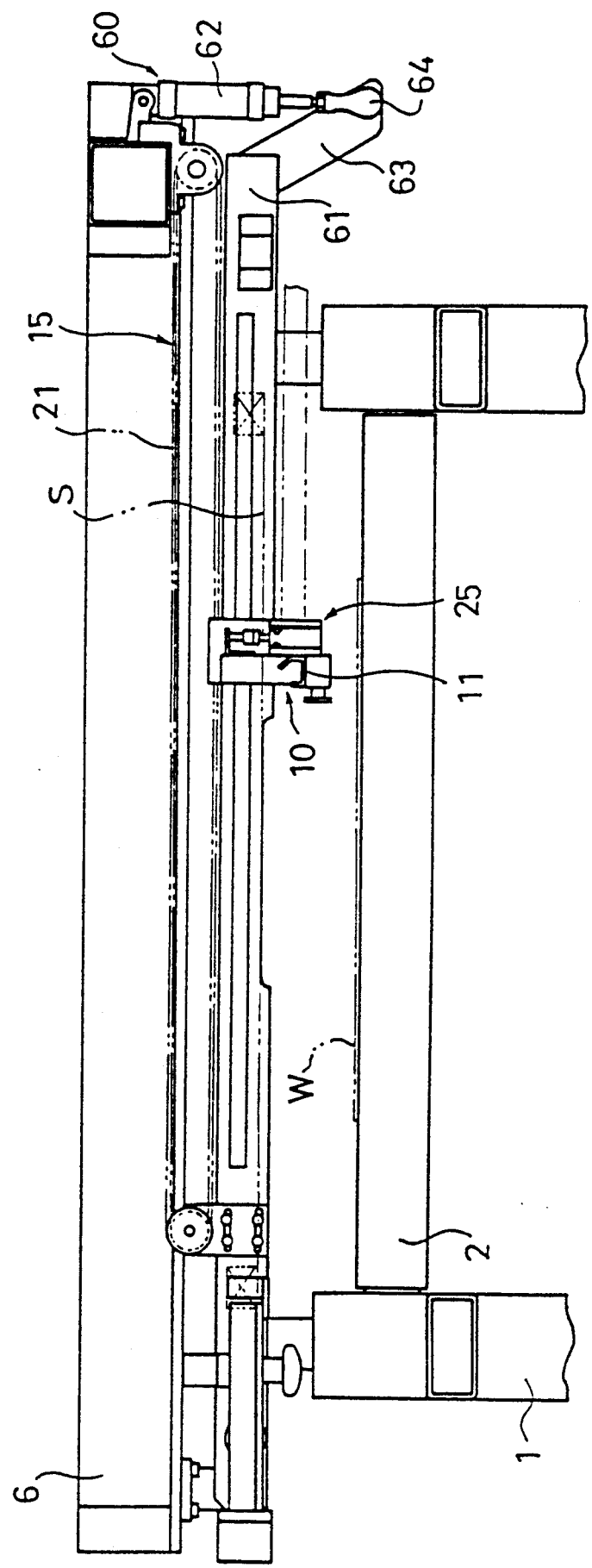
FIG. 3 is a side view of an essential portion of the screen printer.

Referring now to FIGS. 2 and 3 a reference numeral 1 depicts a main frame of a screen printer which is adjustable in height upon installation. On the upper portion of the main frame 1 is provided a print table 2 on which a work W such as a printed circuit board is placed and retained for printing thereon. A squeegee unit 3 is disposed above a screen printing plate S which is arranged above the work W placed on the print table 2. The squeegee unit 3 consists of a squeegee 4 for applying a photo-sensitive material M such as a photo resist and a doctor 5 for uniforming a thickness of the applied photo-sensitive material M. The squeegee 4 and the doctor 5 are vertically movable in the inverse direction to each other.

In FIG. 2, the squeegee unit 3 is mounted on a squeegee frame 6 so as to be movable in the horizontal direction. The squeegee frame 6 is height-adjustably supported on the upper portion of the main frame 1. To this end, the squeegee unit 3 is movable in the vertical direction synchronized with setting of the work W and printing thereon.

Referring to FIG. 4 the screen S is supported by supporting clamp bars 9 arranged between each of opposite ends of a rear frame bar 7 and a front frame bar 8 which are respectively provided opposedly to each other between rear ends and between front ends of opposite off-contact rails 61 (not shown in FIG. 4) described below.

Further, as shown in FIG. 2, the squeegee 4 is movable on the frame 6 in the horizontal direction of the main frame 1. The work W is delivered to be placed on the print table 2 at a regular interval and transferred to the outside of the screen printer by a transfer means T which is arranged in parallel to the frame bars 7, 8 in the horizontal direction of the main frame 1.

Above the main frame 1 is provided a cleaning means 10 comprising a scraping bucket 11 which is movable below the screen S in the same direction as the movement of the squeegee unit 3.

OUTLINE OF A CLEANING MEANS

Figure 1:
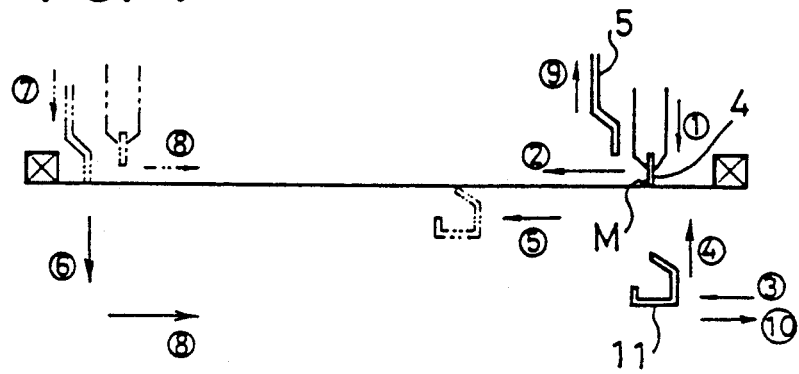
FIG. 1 is a schematic side view showing an operating mechanism of a screen printer according to the invention.

Referring to FIG. 1, the cleaning means 10 is positioned below the screen S and is movable synchronized with movements of the squeegee 4 and the doctor 5 of the squeegee unit 3. The cleaning means 10 comprises the scraping bucket 11 for removing the photo-sensitive material M attached to an underside face of the screen S. As shown in FIG. 6, the scraping bucket 11 comprises a bucket body formed into a concave shape with an open top in profile, and a scraping strip 12 formed on an end of one side wall of the bucket body and inclined in an advance direction of the scraping bucket 11.

As indicated by arrows 1, 2 in FIG. 1, the squeegee 4 moves downward to contact the screen S through which the photo-sensitive material M placed thereon is squeezed down and applied to an upper side face of the work W. At the end of the applying operation of the squeegee 4, the scraping bucket 11 moves in the same direction as that of the squeegee unit 3 from a stand-by position to a scraping-start position. In the scraping-start position, the scraping bucket moves upward such that an upper end thereof contacts an underside face of the screen S (refer to arrows 3, 4). The scraping bucket 11 further moves in an advance direction thereof while being kept in contact with the underside face of the screen S, scrapes and reserves the photo-sensitive material M therein (refer to an arrow 5). After the scraping operation, the scraping bucket 11 moves downward to separate from the underside face of the screen S (refer to an arrow 6). At the same time, the doctor 5 synchronously moves downward such that a lower end thereof contacts an upper side face of the screen S (refer to an arrow 7) while the squeegee 4 moves upward to separate from the upper side face of the screen S. Then, the squeegee 4 which moves away from the screen face and the doctor 5 which contacts the screen face move backward while maintaining their respective non-contact and contact conditions and return to respective stand-by positions. The scraping bucket 11 moves backward to return to the stand-by position in response to the backward movements of the squeegee 4 and the doctor 5 (refer to an arrow 8). The doctor 5 caused to return to the original stand-by position moves to an upward position where the doctor 5 waits for a subsequent operation (refer to an arrow 9). The scraping bucket 11 further retreats from the stand-by position at a reducing speed, stops outside the area of the work W and stands by a subsequent operation (refer to an arrow 10).

Thus operable cleaning means 10 is actuated by a horizontally actuating mechanism 15 for moving the scraping bucket 11 in the advance or retreat direction along the underside face of the screen S, a vertically actuating mechanism 25 for moving the scraping bucket 11 upward to the scraping-start position and downward to the scraping-end position, and a controlling mechanism 45 for adjusting the scraping-start position and the scraping-end position.

HORIZONTALLY ACTUATING MECHANISM FOR THE SCRAPING BUCKET

The horizontally actuating mechanism 15 for the scraping bucket 11 is better shown in FIGS. 3 to 5. The mechanism comprises a driving rail 16 extending along the squeegee frame 6, a linear guide 17 slidably engaged with the rail 16, and a unit base plate 18 on which the linear guide 17 is mounted to form one unit in cooperation therewith. A driving belt 21 is arranged on the unit base plate 18 and extends along the squeegee frame 6 so as to be rotated by a driving motor 19.

As shown in FIG. 5, the driving rail 16 is mounted on an inside face of each of off-contact rails 61 which are respectively positioned on right and left sides of a below-mentioned screen retreating means 60 for separating the screen S apart from the work W in response to applying operation of the squeegee 4.

Referring to FIGS. 3, 4 and 7, the driving motor 19 is fixed on a supporting pipe 22 disposed between back ends or between front ends of the opposite squeegee frames 6 which extend horizontally and are parallel to each other. The driving belt 21 is rotatable through a sprocket and the like which is disposed at an end of a drive shaft drivingly rotated by the driving motor 19.

Referring to FIG. 3, the horizontally actuating mechanism 15 for the scraping bucket 11 is set so as to start its operation in an outward position of the print table 2 in which the applying squeegee 4 is retreated, and end the operation in a position in which a cleaning operation for the screen S ends.

The unit base plates 18 are arranged on the opposite squeegee frames sides and synchronously moved backward and forward by the driving motor 19.

VERTICALLY ACTUATING MECHANISM FOR THE SCRAPING BUCKET

As shown in FIGS. 3 to 6, the vertical actuating mechanism 25 for the scraping bucket 11 comprises a rail 26 extending in the vertical direction along a side face of the unit base plate 18, a bucket pipe side plate 27 which is engaged through a linear ball slide 28 with the rail 26 so as to be vertically movable, a vertically moving cylinder 29 mounted on the unit base plate 18, a cylinder rod of the vertically moving cylinder which is connected to the bucket pipe side plate 27 through a floating joint such that the bucket pipe side plate 27 is vertically movable by the vertically moving cylinder 29.

Therefore, when the vertically moving cylinder 29 acts to expand the cylinder rod thereof, the bucket pipe side plate 27 moves upwardly. Consequently, when the cylinder 29 acts to contract the cylinder rod, the bucket pipe side plate 27 moves downwardly.

In such a case, the vertically moving cylinders 29 opposed to each other are individually operable to control a scraping pressure exerted on the underside face of the screen S. Therefore, an amount of the photo-sensitive material M to be scraped, which is different depending upon size of the work W, is controllable by individually regulating the opposite vertically moving cylinders 29.

MOUNTING OF THE SCRAPING BUCKET

Referring to FIGS. 4 to 6, the scraping bucket 11 is detachably mounted on a bucket pipe 31 which is interposed between the opposite bucket pipe side plates. As better shown in FIG. 6, a mounting plate 32 is arranged on one side wall of the scraping bucket body 11. The mounting plate 32 has a mounting slit for receiving a bolt-shaped locking knob 34 screwed into a locking plate 33 which is arranged on an inner face of the bucket pipe 31. Since the mounting plate 32 is clamped by the locking knob 34 onto the bucket pipe 31 on which the scraping bucket body 11 is placed, the scraping bucket 11 is fixedly mounted on the bucket pipe 31.

AIR SUPPLY FOR VERTICALLY MOVING CYLINDER

Referring to FIGS. 4, 7 and 8, since the horizontally actuating mechanism 15 for the scraping bucket 11 moves backward and forward along the squeegee frame 6 extending in the horizontal direction, the vertically moving cylinder 29 is supplied with air through a supplying pipe enclosed in a plastic tube 36 which is disposed on a supporting roller 35. The supporting roller 35 is provided on a rear frame bar 7 interposed between the opposite off-contact rails 6 mentioned above.

CONTROLLING MECHANISM FOR THE SCRAPING BUCKET

Figure 9:
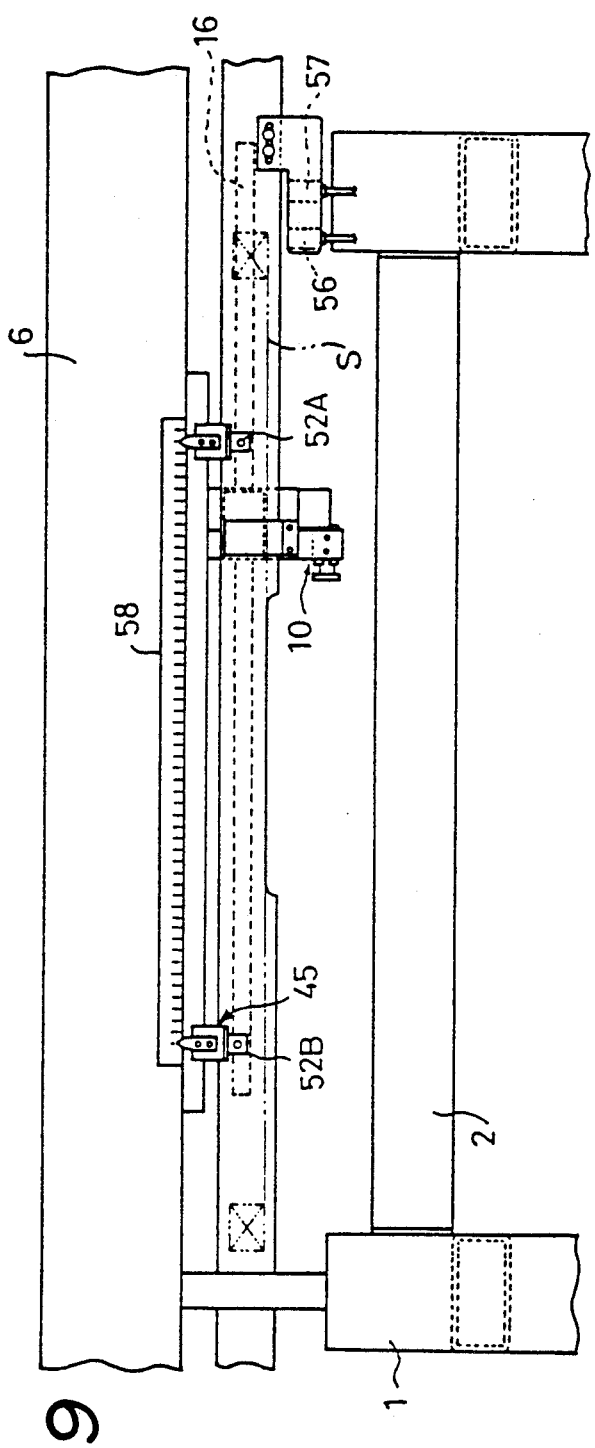
FIG. 9 is a side view of a sensor mechanism of the screen printer.
Figure 10:
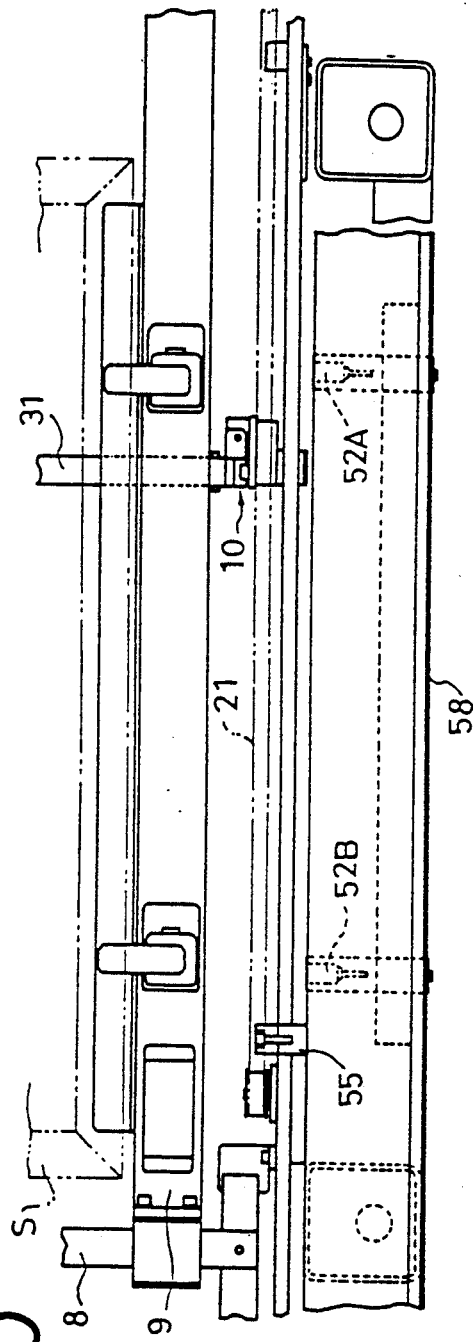
FIG. 10 is a plan view of the sensor mechanism of FIG. 9.
Figure 11:
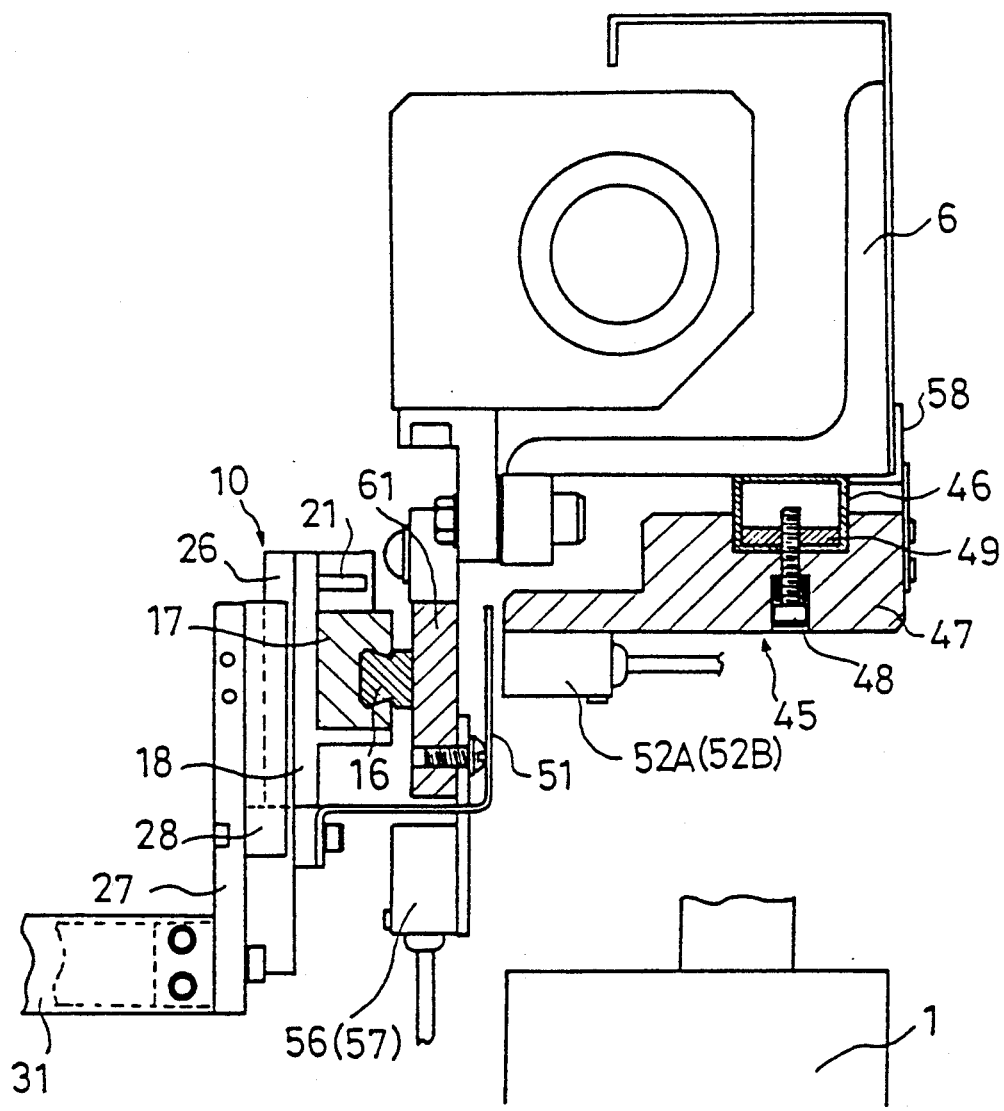
FIG. 11 is a front view of the sensor mechanism of FIG. 9.

Referring to FIGS. 9 to 11, sensor base blocks 47 are slidably mounted on each sensor rail 46 extending along the squeegee frame 6. The sensor base blocks 47 are provided on respective positions corresponding to the scraping-start position and the scraping-end position for the scraping bucket 11. Proximity sensors 52A, 52B are respectively mounted on the sensor base blocks 47. When the proximity sensor 52A detects a sensor plate 51, the bucket pipe side plate 27 moves upward. On the other hand, when the proximity sensor 52B detects the sensor plate 51, the bucket pipe side plate 27 moves downward.

As shown in FIG. 11, the sensor rail 46 which is provided with an aperture on a bottom face thereof, has a lip channel type profile and is mounted on an underside face of the squeegee frame 6 extending in the horizontal direction. The sensor base block 47 is mounted on the sensor rail 46 by screwing a clamp bolt 48 through a spring into a rail inner plate 49 disposed on an lower inside face of the sensor rail 46. The sensor base block 47 is fixed in a desirable position on the sensor rail 46 by screwing and unscrewing the clamp bolt 48.

As shown in FIG. 11, the sensor plate 51 is fixed on the unit base plate 18 so as to be opposed to an outer face of the off-contact rail 61. Further, the proximity sensors 52A, 52B are opposed to the outer face of the off-contact rail 61 so as to detect the sensor plate 51 during a horizontal movement of the unit base plate 18.

To this end, the horizontally actuating mechanism 15 for the scraping bucket 11 actuates the unit base plate 18 to start the horizontal movement thereof. When the sensor plate 51 moves so as to face the proximity sensor 52A which is arranged in the scraping-start position, the vertically actuating mechanism 25 for the scraping bucket 11 actuates the bucket pipe side plate 27 to move upward to a predetermined position and advance in the horizontal direction. After such a movement of the bucket pipe side plate 27, when the sensor plate 51 moves so as to face the proximity sensor 52B which is arranged in the scraping-end position, the vertically actuating mechanism 25 for the scraping bucket 11 actuates the bucket pipe side plate 27 to move downward to a predetermined position and retreat in the horizontal direction.

In FIG. 10, a reference numeral 55 depicts a damper for regulating an advance position for the unit base plate 18. A reference numeral 56 depicts a proximity sensor arranged in a speed-reducing position in which a reduction of a moving speed of the unit base plate 18 starts when the unit base plate 18 retreats to return to a stand-by position thereof. Further, a reference numeral 57 depicts a proximity sensor arranged in the stand-by position in which the unit base plate 18 stops retreating.

The respective positions of these proximity sensors 52A, 52B which are determined as the scraping-start position and the scraping-end position for the scraping bucket 11 are previously adjusted and set corresponding to an area of the work W to which the photo-sensitive material M to be scraped is applied. As shown in FIG. 9, a stroke scale 58 for adjusting the positions of the proximity sensors 52A, 52B is provided on an outer face of the squeegee frame 6.

SCREEN RETREATING MEANS

Referring to FIGS. 2 and 3, in order to prevent a bleeding and the like occurring upon an applying operation, the screen retreating means 60 is provided for separating the screen S apart from the work W in response to the applying operation of the squeegee 4.

The screen retreating means 60 comprises an off-contact rail 61 which extends in the direction of applying operation of the squeegee 4 along each of the opposite squeegee frames 6, an off-contact cylinder 62 supported at each one end of the squeegee frames 6 at which the squeegee 4 starts the applying operation, and an off-contact joint plate 63 which is connected to an end portion of the off-contact rail 61 and to the off-contact cylinder through a uni-ball joint 64. The off-contact rail 61 is supported on the squeegee frame 6 so as to be raised up to an applying-end position for the squeegee 4.

As shown in FIG. 3, the off-contact cylinder 62 is supported at an end of the squeegee frame 6 by a rear portion of the cylinder body. The off-contact joint plate 63 extends diagonally inclined toward the uni-ball joint 64, from the end portion of the off-contact rail 61 outside of which the off-contact cylinder 62 is positioned. When the off-contact cylinder 62 actuates the cylinder rod to expand downward, the end portion of the off-contact rail 61 is inclinedly lowered. Consequently, when the off-contact cylinder 62 actuates the cylinder rod to contract upward, the end portion of the off-contact rail 61 is inclinedly raised up.

Accordingly, when the squeegee 4 starts the applying operation on the screen S, the off-contact cylinder 62 actuates the cylinder rod to contract upward so that the end portion of the off-contact rail 61 is raised up. Then, the screen S supported on the off-contact rail 61 is inclinedly raised up to separate apart from the work W in response to the applying operation of the squeegee 4. At the end of the applying operation, the off-contact cylinder 62 actuates the cylinder rod to expand so that the screen S is moved to return to the original position thereof in the horizontal direction before the start of the applying operation.

OPERATION

The advantages of the screen printer according to the invention will be better understood from a description of its operation. A work W is disposed in a predetermined position on a print table 2. A squeegee unit 3 acts to start applying a photo-sensitive material M to the work W.

When the applying operation of the squeegee unit 3 starts, a screen retreating means 60 actuates, at the same time, a screen S to retreat from the work W in response to the applying operation of a squeegee 4 which is incorporated in the squeegee unit 3.

In the applying operation in which the squeegee 4 horizontally advances while being kept in contact with the screen S, if the photo-sensitive material M is squeezed through the screen S and applied onto such a work W as a printed circuit board having a plurality of through holes, the photo-sensitive material M is attached to portions of an underside face of the screen S corresponding to the through holes.

At the end of such an applying operation, a cleaning means 10 starts its operation.

A scraping bucket 11 disposed in a stand-by position is actuated to advance by a horizontally actuating mechanism 15. When the scraping bucket 11 reaches a proximity sensor 52A arranged in a scraping-start position which is controllable by a controlling mechanism 45, the proximity sensor 52A detects a sensor plate 51 fixed on a unit base plate 18 so that a vertically actuating mechanism 25 for the scraping bucket 11 is actuated. A vertically moving cylinder 29 of the vertically actuating mechanism 25 actuates a bucket pipe side plate 27 to move upward so that an upper end of the scraping bucket 11 abuts against the underside face of the screen S.

When the upper end of the scraping bucket 11 advances while being kept in contact with the underside face of the screen S, the photo-sensitive material M attached to the underside face of the screen S is scraped to be fallen into the scraping bucket. In this case, since a scraping strip 12 of the scraping bucket 11 is inclined toward the advance direction, the scraping bucket 11 completely scrapes the photo-sensitive material M attached to the underside face of the screen S and drops the material M along the inclined underside of the scraping strip 12 into the scraping bucket.

When the scraping bucket 11 advances to reach a proximity sensor 52B arranged in a scraping-end position, the proximity sensor 52B detects the sensor plate 51 fixed on a unit base plate 18 so that a vertically actuating mechanism 25 for the scraping bucket 11 is actuated. A vertically moving cylinder 29 of the vertically actuating mechanism 25 actuates a bucket pipe side plate 27 to move downward so that the upper end of the scraping bucket 11 separates apart from the underside face of the screen S.

After the separation of the upper end of the scraping bucket 11 from the underside face of the screen, a doctor 5 of the squeegee unit 3 moves downward to contact an upper side face of the screen S. The doctor retreats in inverse direction of the applying operation of the squeegee 4 while being kept in contact with the upper side face of the screen S so as to form a photo-sensitive material layer M of even thickness. The scraping bucket 11 is synchronized with the retreat movement of the doctor 5 to move backward and return to the scraping-start position for standing by a subsequent operation.

An operating time is saved by synchronizing the retreat operation of the doctor 5 with that of the scraping bucket 11.

As is obvious from the aforementioned preferred embodiments, the apparatus according to the invention achieves a considerable improvement in yield of products without incomplete printing for a work W to be set following a sufficient removal of a photo-sensitive material M left on an underside face of a screen S after a preceding applying operation.

Namely, the apparatus is provided with a cleaning means 10 comprising a scraping bucket 11 for removing the photo-sensitive material M which is left on the underside face of the screen S after the applying operation of a squeegee 4. The scraping bucket 11 comprises a bucket body formed into a concave shape with an open top in profile, and a scraping strip 12 formed on an end of one side wall of the bucket body and inclined in an advance direction of the scraping bucket 11.

Specially, the cleaning means 10 is actuated by a horizontally actuating mechanism 15 for moving the scraping bucket 11 in the advance or retreat direction thereof along the underside face of the screen S, a vertically actuating mechanism 25 for moving the scraping bucket 11 upward to a scraping-start position and downward to a scraping-end position, and a controlling mechanism 45 for adjusting the scraping-start position and the scraping-end position. Accordingly, since the start and end positions for scraping the photo-sensitive material M left on the underside face of the screen S are desirably adjustable in an area of the work W, the photo-sensitive material M can be scraped and removed from an area of the underside face of the screen S which corresponds to the area of the work W.

Further, the scraping bucket 11 comprises the bucket body formed into the concave shape with the open top in profile, and the scraping strip 12 formed on the end of one side wall of the bucket body inclinedly in the advance direction of the scraping bucket 11. Therefore, the photo-sensitive material M attached to the underside face of the screen S is completely scraped, dropped into the scraping bucket 11 along the inclining underside face of the scraping strip 12 and reserved therein. To this end, since the photo-sensitive material M scraped is not attached to an upper end portion of the scraping strip 12, the screen S can be cleaned without attachment for the photo-sensitive material M scraped by the scraping strip 12 even in a repeating scraping operation.

The horizontal actuating mechanism 15, the vertical actuating mechanism 25 and the controlling mechanism 45 serve in cooperation with one another for such a sequential movement of the scraping bucket 11 as horizontally advancing the scraping bucket 11 from a stand-by position to the scraping-start position, moving the scraping bucket 11 upward to contact an upper end thereof with the underside face of the screen S and stand by the scraping operation, horizontally advancing the scraping bucket 11 while keeping in contact with the underside face of the screen S, moving the scraping bucket 11 downward in the scraping-end position, retreating the scraping bucket 11 while maintaining in the downward position from the scraping-end position, and returning to the stand-by position for the scraping bucket 11.

In accordance with the invention, a printing material such as the photo-sensitive material attached to the underside face of the screen is scraped to be removed therefrom. Further, the printing material scraped is not attached again to the underside face of the screen. For this reason, the printing material left on a screen portion corresponding to a through hole of such a work as a printed circuit board is completely removed resulting in prevention of a defective printing. Consequently, there is provided considerable improvements in printing according to the invention.

What is claimed is:

1. A screen printer comprising a squeegee for applying a printing material to a work face when the squeegee moves on an upper side face of a screen while being kept in contact therewith, a doctor for uniforming a thickness of the printing material left on the upper side face of the screen, and a cleaning means including a scraping bucket which moves on an underside face of the screen while being kept in contact therewith so as to scrape the printing material attached to the underside face of the screen upon applying operation of the squeegee, said scraping bucket being provided with a bucket body formed into a concave shape with an open top in profile and with a scraping strip formed on an end of one side wall of the bucket body, which is inclined toward an advance direction of the scraping bucket.

2. The screen printer according to claim 1, further comprising a horizontally actuating mechanism for moving the scraping bucket in an advance or retreat direction thereof along the underside face of the screen, a vertically actuating mechanism for moving the scraping bucket upward to a scraping-start position and downward to a scraping-end position, and a controlling mechanism for adjusting the scraping-start position and the scraping-end position.

3. The screen printer according to claim 2, wherein said horizontally actuating mechanism for the scraping bucket comprises a driving rail extending in an advance or retreat direction of the squeegee, a unit base plate slidably engaged with the rail, and a driving belt which is arranged on the unit base plate and extends in a moving direction of the unit base plate so as to be rotated.

4. The screen printer according to claim 2, further comprising a unit base plate on which the printer is mounted, wherein said vertically actuating mechanism for the scraping bucket comprises a bucket pipe side plate vertical-movably mounted on a side face of the unit base plate, a vertically moving cylinder mounted on the unit base plate, a cylinder rod of the vertically moving cylinder connected to the bucket pipe side plate for supporting a bucket pipe on which the scraping bucket is detachably mounted, so that the bucket pipe side plate is vertically movable by action of the vertically moving cylinder.

5. The screen printer according to claim 4, wherein said controlling mechanism for the scraping bucket comprises sensor base blocks, respective sensor rails on which said sensor base blocks are slidably mounted, extending in the advance or retreat direction of the squeegee in positions corresponding to the scraping-start position and the scraping-end position for the scraping bucket, sensor plates fixed on the unit base plate, and proximity sensors which are respectively mounted on the sensor base blocks in order to detect said sensor plates so that the bucket pipe side plate moves upward or downward in response to detection of the sensor plate by the respective proximity sensors mounted in the scraping-start position and the scraping-end position.

* * * * *